United States Patent
Yu et al.

(10) Patent No.: US 8,766,443 B2
(45) Date of Patent: Jul. 1, 2014

(54) ANISOTROPIC CONDUCTIVE FILM COMPOSITION, ANISOTROPIC CONDUCTIVE FILM, AND SEMICONDUCTOR DEVICE BONDED BY THE SAME

(71) Applicants: Arum Yu, Uiwang-si (KR); Nam Ju Kim, Uiwang-si (KR); Kyoung Soo Park, Uiwang-si (KR); Young Woo Park, Uiwang-si (KR); Joon Mo Seo, Uiwang-si (KR); Kyung Il Sul, Uiwang-si (KR); Dong Seon Uh, Uiwang-si (KR); Hyun Min Choi, Uiwang-si (KR)

(72) Inventors: Arum Yu, Uiwang-si (KR); Nam Ju Kim, Uiwang-si (KR); Kyoung Soo Park, Uiwang-si (KR); Young Woo Park, Uiwang-si (KR); Joon Mo Seo, Uiwang-si (KR); Kyung Il Sul, Uiwang-si (KR); Dong Seon Uh, Uiwang-si (KR); Hyun Min Choi, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 3 days.

(21) Appl. No.: 13/710,728

(22) Filed: Dec. 11, 2012

(65) Prior Publication Data
US 2013/0154093 A1 Jun. 20, 2013

(30) Foreign Application Priority Data
Dec. 14, 2011 (KR) .................. 10-2011-0134685

(51) Int. Cl.
*H01L 23/48* (2006.01)

(52) U.S. Cl.
USPC .......... 257/746; 257/686; 257/741; 257/761; 257/788

(58) Field of Classification Search
None
See application file for complete search history.

(56) References Cited

U.S. PATENT DOCUMENTS

2009/0140216 A1* 6/2009 Kim et al. .................. 252/511

FOREIGN PATENT DOCUMENTS

| JP | 2001-261780 | 9/2011 |
| KR | 10-2011-0074320 A | 6/2011 |

* cited by examiner

*Primary Examiner* — Kyoung Lee
(74) *Attorney, Agent, or Firm* — Lee & Morse, P.C.

(57) ABSTRACT

An anisotropic conductive film composition for bonding an electronic device may include a hydrogenated bisphenol A epoxy monomer represented by Formula 1 or a hydrogenated bisphenol A epoxy oligomer represented by Formula 2:

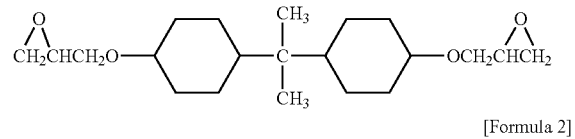

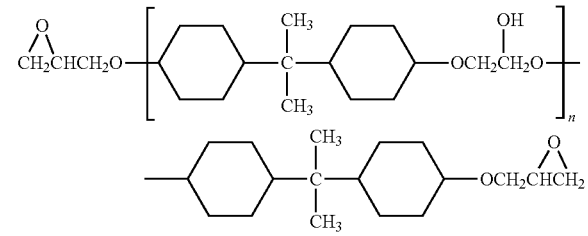

where n may be an integer from 1 to about 50.

18 Claims, 1 Drawing Sheet

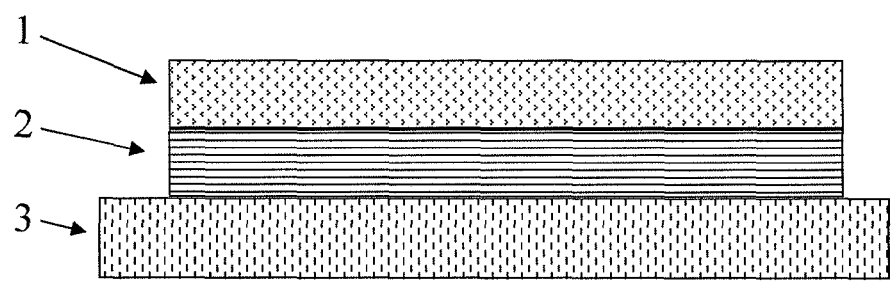

ANISOTROPIC CONDUCTIVE FILM COMPOSITION, ANISOTROPIC CONDUCTIVE FILM, AND SEMICONDUCTOR DEVICE BONDED BY THE SAME

CROSS-REFERENCE TO RELATED APPLICATION

This application claims priority under 35 U.S.C. §119 to Korean Patent Application No. 10-2011-0134685, filed on Dec. 14, 2011, in the Korean Intellectual Property Office, and entitled: "ANISOTROPIC CONDUCTIVE FILM COMPOSITION, ANISOTROPIC CONDUCTIVE FILM, AND SEMICONDUCTOR DEVICE BONDED BY THE SAME," the entire contents of which is hereby incorporated by reference.

BACKGROUND

Embodiments relate to an anisotropic conductive film composition, an anisotropic conductive film, and an electronic device bonded by the anisotropic conductive film.

SUMMARY

Embodiments are directed to an anisotropic conductive film composition for bonding an electronic device, the composition may include:
a first component that may include one or more selected from the group of a hydrogenated bisphenol A epoxy monomer represented by Formula 1 and a hydrogenated bisphenol A epoxy oligomer represented by Formula 2:

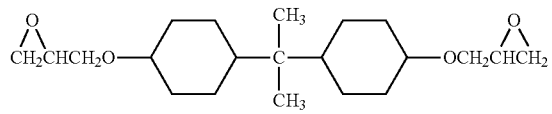

[Formula 1]

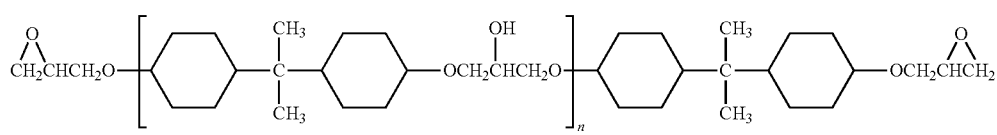

[Formula 2]

where n may be an integer from 1 to about 50;
a sulfonium curing agent;
a binder resin; and
conductive particles.

The first component may include the hydrogenated bisphenol A epoxy monomer represented by Formula 1 and the hydrogenated bisphenol A epoxy oligomer represented by Formula 2.

The anisotropic conductive film composition may include about 1 to about 50 parts by weight of the first component, about 1 to about 20 parts by weight of the sulfonium curing agent, about 20 to about 60 parts by weight of the binder resin, and about 10 to about 50 parts by weight of the conductive particles, based on 100 parts by weight of the anisotropic conductive film composition.

The sulfonium curing agent may include an aromatic sulfonium salt.

The aromatic sulfonium salt may be represented by Formula 3:

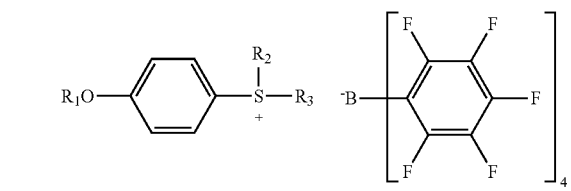

[Formula 3]

where $R_1$ may be selected from the group of hydrogen, an alkyl group, an alkoxy group, a methoxy carbonyl group, and an ethoxy carbonyl group, $R_2$ may be selected from the group of a methyl group, an ethyl group, a propyl group, and a butyl group, and $R_3$ may be selected from the group of a nitrobenzyl group, a dinitrobenzyl group, a trinitrobenzyl group, and a naphthylmethyl group.

The sulfonium curing agent may include a sulfonium salt represented by Formula 4:

[Formula 4]

where $R^1$ may be selected from the group of a benzyl group, a substituted benzyl group, a phenacyl group, a substituted phenacyl group, an allyl group, a substituted allyl group, an alkoxy group, a substituted alkoxy group, an aryloxy group, and a substituted aryloxy group, $R^2$ and $R^3$ each independently may be selected from the group of a benzyl group, a substituted benzyl group, a phenacyl group, a substituted phenacyl group, an allyl group, a substituted allyl group, an alkoxy group, a substituted alkoxy group, an aryloxy group, a substituted aryloxy group, fluorine, chlorine, bromine, a hydroxyl group, a carboxyl group, a mercapto group, a cyano group, a nitro group, a $C_1$ to $C_{18}$ straight, branched, or cyclic alkyl group, and a substituted $C_1$ to $C_{18}$ straight, branched, or cyclic alkyl group, and $R^1$ and $R^2$, $R^1$ and $R^3$, or $R^2$ and $R^3$ optionally may be combined with each other into a cyclic structure.

The aromatic sulfonium salt may be represented by Formula 5:

[Formula 5]

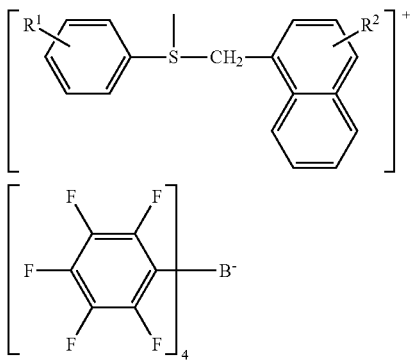

where $R^1$ may be selected from the group of a hydroxyl group, $R^5O-$,

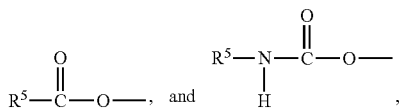

$R^5$ may be selected from the group of an aromatic hydrocarbon, a substituted aromatic hydrocarbon, an aliphatic hydrocarbon, a substituted aliphatic hydrocarbon, a carboxyl group, a sulfonyl group, and combinations thereof, and $R^2$ may be selected from the group of hydrogen and $C_1$ to $C_6$ alkyl groups.

The sulfonium curing agent may include:

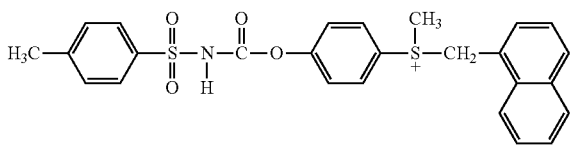

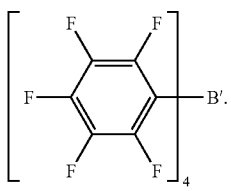

The binder resin may include an epoxy resin having at least two epoxy groups and having an epoxy equivalent weight of about 90 g/eq to about 5,000 g/eq.

The binder resin may have a weight average molecular weight of about 5,000 g/mol to about 150,000 g/mol.

The binder resin may include a fluorene epoxy resin.

The conductive particles may include at least one selected from the group of metal particles and organic or inorganic particles coated with a metal.

The anisotropic conductive film composition may provide a glass transition temperature of about 120° C. or more.

The anisotropic conductive film composition may be for a chip-on-glass (COG) device.

Embodiment are also directed to an electronic device that may include a wiring substrate, the wiring substrate including glass, and an electrical element bonded to the wiring substrate by an anisotropic conductive film that may be a cured product of the anisotropic conductive film composition.

Embodiments are also directed to a semiconductor device bonded by an anisotropic conductive film formed from a composition that may include a hydrogenated bisphenol A epoxy monomer represented by Formula 1 or a hydrogenated bisphenol A epoxy oligomer represented by Formula 2:

[Formula 1]

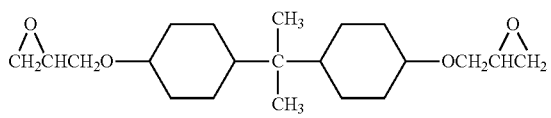

[Formula 2]

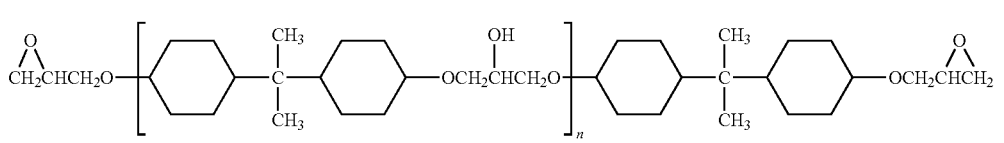

where n may be an integer from 1 to about 50, the anisotropic conductive film may have a curing rate of about 70% or more when cured at about 150 to about 170° C. for about 5 to about 10 seconds, and a glass transition temperature of about 120° C. or more.

The curing rate of the anisotropic conductive film may be about 70% or more when cured at about 150° C. for about 5 to 10 seconds.

The anisotropic conductive film may bond a chip-on-glass (COG) device.

BRIEF DESCRIPTION OF THE DRAWING

Features will become apparent to those of skill in the art by describing in detail exemplary embodiments with reference to the attached drawing in which:

FIG. 1 illustrates an electronic device having elements bonded by an anisotropic conductive film according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

According to an embodiment, an electronic device may be bonded by an anisotropic conductive film composition including: (a) a hydrogenated bisphenol A epoxy monomer represented by Formula 1 and/or a hydrogenated bisphenol A epoxy oligomer represented by Formula 2; (b) a sulfonium curing agent; (c) a binder resin; and (d) conductive particles.

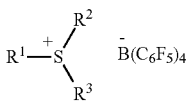

[Formula 4]

In Formula 4, $R^1$ may include one or more of a benzyl group, a substituted benzyl group, a phenacyl group, a substituted phenacyl group, an allyl group, a substituted allyl group, an alkoxy group, a substituted alkoxy group, an aryloxy group, and a substituted aryloxy group. $R^2$ and $R^3$ each independently may be the same as $R^1$ or may include one or more of fluorine, chlorine, bromine, a hydroxyl group, a carboxyl group, a mercapto group, a cyano group, a nitro group, and a $C_1$ to $C_{18}$ straight, branched. $R^1$, $R^2$, and/or $R^3$ may be substituted, e.g., by an azido group. $R^1$ and $R^2$, $R^1$ and $R^3$, or $R^2$ and $R^3$ may be combined with each other into a cyclic structure.

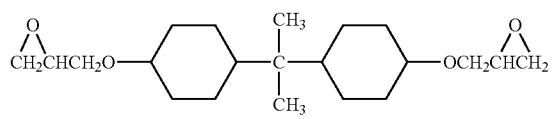

[Formula 1]

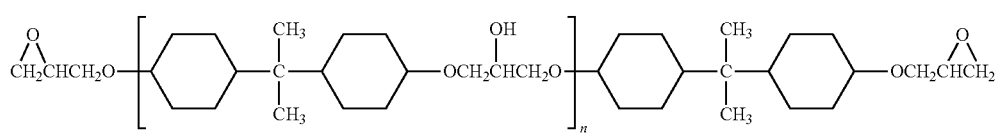

[Formula 2]

In Formula 2, n may be an integer from 1 to 50.

The hydrogenated bisphenol A epoxy monomer represented by Formula 1 or the hydrogenated bisphenol A epoxy oligomer represented by Formula 2 may form a dense structure (e.g., as compared with a bisphenol A epoxy), and thus hardness may be substantially increased. Further, the hydrogenated bisphenol A epoxy monomer or the hydrogenated bisphenol A epoxy oligomer may have a linearly elongated structure, and thus hardness may be substantially increased. Accordingly, the anisotropic conductive film composition may have a substantially improved moisture resistance and heat resistance, and a substantially improved connection reliability.

The hydrogenated bisphenol A epoxy monomer represented by Formula 1 or the hydrogenated bisphenol A epoxy oligomer represented by Formula 2 may be present in an amount of about 1 to about 50 parts by weight, more particularly about 5 to about 30 parts by weight, based on 100 parts by weight of the anisotropic conductive film composition. Within this range, the anisotropic conductive film composition may have substantially improved moisture resistance and heat resistance.

The sulfonium curing agent may include a suitable sulfonium curing agent.

Examples of the sulfonium curing agent may include sulfonium salts represented by Formulae 3-5.

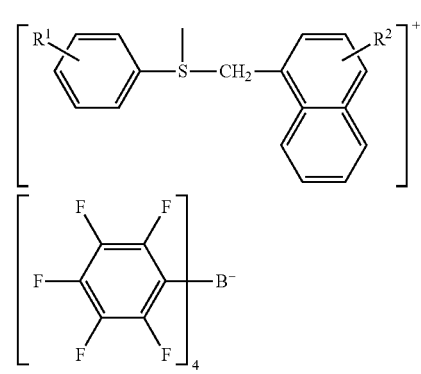

[Formula 5]

In Formula 5, $R^1$ may include one or more of a hydroxyl group, $R^5O—$,

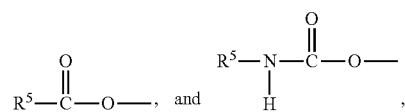

where $R^5$ may include one or more of an aromatic hydrocarbon, a substituted aromatic hydrocarbon, an aliphatic hydrocarbon, a substituted aliphatic hydrocarbon, a carboxyl group, a sulfonyl group, and combinations thereof. $R^2$ may include one or more of hydrogen and a $C_1$ to $C_6$ alkyl group.

An example of Formula 5 may include,

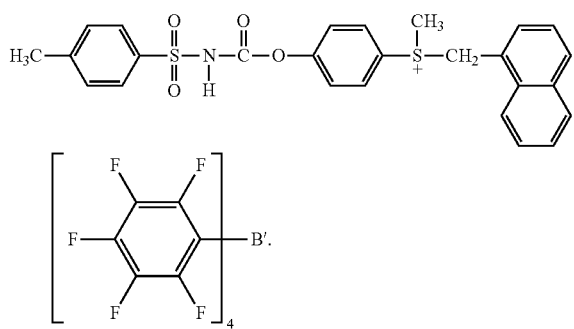

The sulfonium curing agent may include an aromatic sulfonium salt, more particularly an aromatic sulfonium salt represented by Formula 3, and thus may achieving a rapid low-temperature curing of the film (e.g., due to a relatively high efficiency in generating cations by thermal activation energy).

[Formula 3]

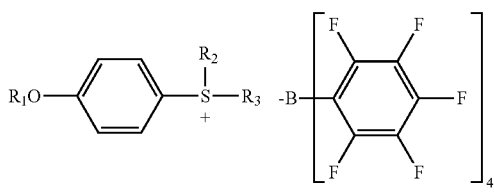

In Formula 3, $R_1$ may include one or more of hydrogen, an alkyl group, a methoxy carbonyl group, and an ethoxy carbonyl group. $R_2$ may include one or more of a methyl group, an ethyl group, a propyl group, and a butyl group. $R_3$ may include one or more of a nitrobenzyl group, a dinitrobenzyl group, a trinitrobenzyl group, and a naphthylmethyl group.

The sulfonium curing agent included in the anisotropic conductive film composition may promote an improved rapid low-temperature curing.

The sulfonium curing agent may be present in an amount of about 1 to about 20 parts by weight, more particularly about 1 to about 10 parts by weight, based on 100 parts by weight of the anisotropic conductive film composition. Within this range, the anisotropic conductive film composition may realize relatively low-temperature quick curing and while being substantially prevented from being cured at room temperature or less.

The binder resin may include a suitable binder resin (e.g., a binder resin that does not substantially hinder curing of the hydrogenated bisphenol A epoxy monomer or oligomer). Examples of the binder resin may include a polyimide resin, a polyamide resin, a phenoxy resin, an epoxy resin, a polymethacrylate resin, a polyacrylate resin, a polyurethane resin, a polyester resin, a polyester urethane resin, a polyvinyl butyral resin, a styrene-butylene-styrene (SBS) resin and epoxy modifications thereof, a styrene-ethylene-butylene-styrene (SEBS) resin and modifications thereof, acrylonitrile butadiene rubber (NBR) and hydrogenated compounds thereof, and the like, which may be used alone or as mixtures.

Further, as the binder resin, a thermally curable epoxy resin may be used, for example, an epoxy resin having an epoxy equivalent weight of about 90 to about 5,000 g/eq and at least two epoxy groups.

The thermally curable epoxy resin may include one or more of, e.g., bisphenol, novolac, glycidyl, aliphatic, alicyclic, or aromatic epoxy resins, and the like. Further, a solid epoxy resin at room temperature (e.g., about 20° C. to about 25° C.) and a liquid epoxy resin at room temperature may be used in combination, and a flexible epoxy resin may be further added to the combination.

Examples of the solid epoxy resin at room temperature may include, e.g., one or more of a phenol novolac epoxy resin, a cresol novolac epoxy resin, an epoxy resin having a dicyclopentadiene backbone, a bisphenol A or F polymer, a modified epoxy resin, and the like. Examples of the liquid epoxy resin at room temperature may include one or more of bisphenol A, F, mixed epoxy resins, and the like.

Examples of the flexible epoxy resin may include, for example, one or more of a dimer acid modified epoxy resin, an epoxy resin having a propylene glycol backbone, a urethane modified epoxy resin, and the like. The aromatic epoxy resin may be, for example, at one or more of naphthalene, anthracene, pyrene resins, and the like.

In addition, in the binder resin a fluorene epoxy resin may be used, and thus the film may secure substantially increased glass transition temperature and may have substantially improved durability.

The binder resin may have a suitable weight average molecular weight (e.g., in terms of facilitation of film formation), for example a relatively high weight average molecular weight. For example, the binder resin may have a weight average molecular weight of about 5,000 to about 150,000 g/mol, more particularly about 10,000 to about 80,000 g/mol. Within this range, the binder resin may have substantially improved compatibility with other components of the film composition and may facilitate film formation.

The fluorene epoxy resin may be present in an amount of 0 to about 30 parts by weight, more particularly about 1 to about 15 parts by weight, based on 100 parts by weight of the anisotropic conductive film composition.

The binder resin may be present in an amount of about 20 to about 60 parts by weight, more particularly about 30 to about 50 parts by weight, based on 100 parts by weight of the anisotropic conductive film composition.

The conductive particles may include one or more of metal particles, organic or inorganic particles coated with metal such as gold or silver, and the like. Further, insulated particles may be included to secure electric insulation (e.g., when a relatively large amount of conductive particles are used). Example of the conductive particles may include one or more of metal particles, e.g., Au, Ag, Ni, Cu, and Pb particles, and the like; carbon particles; metal-coated resin particles, e.g., particles of polyethylene, polypropylene, polyester, polystyrene, polyvinyl alcohol and modified resins thereof coated with Au, Ag, Ni, and the like; conductive particles insulated by further coating with insulation particles; and the like.

The conductive particles may be present in an amount of about 10 to about 50 parts by weight, more particularly about 20 to about 40 parts by weight, based on 100 parts by weight of the anisotropic conductive film composition. Within this range, the film composition may secure substantially improved anisotropic conductivity and electric shorting due to a relatively excessive amount of the conductive particles may be substantially prevented.

The anisotropic conductive film composition may further include a suitable solvent. The solvent may be uniformly mixed with the hydrogenated bisphenol A epoxy monomer or oligomer, the sulfonium curing agent, the binder resin, and the conductive particles, and thus may substantially lower the viscosity of the composition, thereby facilitating film formation.

The solvent may include a suitable solvent. For example, the solvent may include one or more of toluene, xylene, propylene glycol monomethyl ether acetate, benzene, acetone, methyl ethyl ketone, tetrahydrofuran, dimethylformamide (DMF), cyclohexanone, and the like.

cal properties after a reliability test, and an anisotropic conductive film having a glass transition temperature of about 120° C. or more may be substantially prevented from being deformed after bonding, thereby substantially preventing occurrence of a short circuit in connection.

In an embodiment, the anisotropic conductive film may include a hydrogenated bisphenol A epoxy monomer represented by Formula 1 and/or a hydrogenated bisphenol A epoxy oligomer represented by Formula 2.

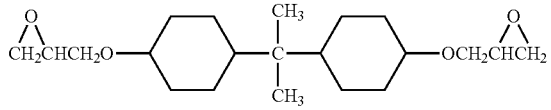

[Formula 1]

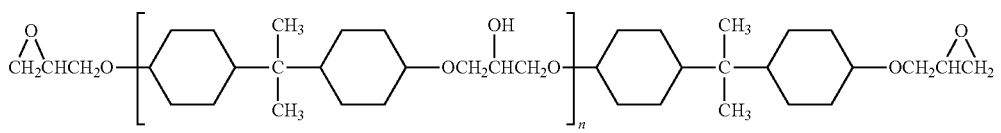

[Formula 2]

The anisotropic conductive film composition may further include suitable additives, such as, e.g., a polymerization inhibitor, an antioxidant, a heat stabilizer, a curing accelerator, a coupling agent, and the like.

Examples of the polymerization inhibitor may include, e.g., one or more of hydroquinone, hydroquinone monomethyl ether, p-benzoquinone, phenothiazine, and the like, and mixtures thereof.

Examples of the antioxidant and/or the heat stabilizer may include, e.g., one or more of tetrakis-(methylene-(3,5-di-ter-butyl-4-hydrocinnamate)methane), 3,5-bis(1,1-dimethylethyl)-4-hydroxybenzenepropanoic acid thiol di-2,1-ethanediyl ester, octadecyl 3,5-di-t-butyl-4-hydroxyhydrocinnamate, all of which are commercially available from Ciba, 2,6-di-t-butyl-p-methylphenol, and the like.

Examples of the curing accelerator may include one or more of solid imidazole curing accelerators, solid amine curing accelerators, liquid amine curing accelerators, and the like.

Examples of the coupling agent may include one or more of vinyltrichlorosilane, vinyltrimethoxysilane, 3-glycidoxypropyltrimethoxysilane, 3-methacryloxypropyltrimethoxysilane, 2-aminoethyl-3-aminopropylmethyldimethoxysilane, 3-ureidopropyltriethoxysilane, and the like.

After curing, the anisotropic conductive film composition may provide a relatively high modulus, a relatively high glass transition temperature, and relatively hard properties, and thus may particularly be used for COG.

According to an embodiment, an electronic device may be bonded by an anisotropic conductive film having a curing rate of about 70% or more when cured at about 150 to about 170° C. for about 5 to about 10 seconds, and a glass transition temperature of about 120° C. or more.

According to an embodiment, an electronic device may be bonded by an anisotropic conductive film having a curing rate of about 70% or more when cured at about 150° C. for about 5 to about 10 seconds, and a glass transition temperature of about 120° C. or more.

An anisotropic conductive film having a curing rate of about 70% or more may substantially maintain initial physin may be an integer from 1 to 50.

There is no particular restriction as to a method of forming the anisotropic conductive film, and a suitable method may be used. A special apparatus or facility may not be required in a method of forming an anisotropic conductive film. For example, an anisotropic conductive film may be produced by the following procedure: a binder resin may be dissolved and liquefied in an organic solvent; the remaining components may be added to the solution and stirred for a certain period of time; and the mixture may be applied to a release film to an appropriate thickness, e.g., about 10 to about 50 µm, and dried for a certain period of time to volatilize the organic solvent.

FIG. 1 illustrates an electronic device having elements bonded by an anisotropic conductive film according to an embodiment. The electronic device may include a wiring substrate 3, an anisotropic conductive film 2 attached to an element mounting surface of the wiring substrate 3, and an electrical element (e.g., a semiconductor chip) 1 bonded to the wiring substrate 3 by the anisotropic conductive film 2.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE 1

Preparation of Anisotropic Conductive Film Composition Including Hydrogenated Bisphenol A Epoxy Monomer 14 parts by weight of a hydrogenated bisphenol A epoxy monomer (Formula 1), 40 parts by weight of bisphenol A epoxy (YP-50, Kukdo Chemical Co., Ltd.), 2 parts by weight of polycyclic aromatic ring containing epoxy (HP4032D, Dainippon Ink & Chemicals), 5 parts by weight of diglycidyl terephthalate epoxy (EX-711, Nagase ChemteX), 4 parts by weight of dry silica (R812, Degussa), 5 parts by weight of a sulfonium cation curing agent (SI-60L, Samshin Chemicals), 29 parts by weight of polymer particle coated with nikel, and 1 part by weight of γ-glycidoxypropyltrimethoxy silane (KBM403, Shin-Etsu Chemical) were mixed into an anisotropic conductive film composition. These components were mixed with 100 parts by weight of PGMA as a solvent, followed by coating and drying.

EXAMPLE 2

Preparation of Anisotropic Conductive Film Composition Including Fluorene Epoxy Resin 3 parts by weight of a fluorene BPA resin (FX-293, Shin Nippon Steel Corp.), 11 parts by weight of a hydrogenated bisphenol A epoxy monomer (Formula 1), 40 parts by weight of bisphenol A epoxy (YP-50, Kukdo Chemical Co., Ltd.), 2 parts by weight of polycyclic aromatic ring containing epoxy (HP4032D, Dainippon Ink & Chemicals), 5 parts by weight of diglycidyl terephthalate epoxy (EX-711, Nagase ChemteX), 4 parts by weight of dry silica (R812, Degussa), 5 parts by weight of a sulfonium cation curing agent (SI-60L, Samshin Chemicals), 29 parts by weight of polymer particle coated with nikel, and 1 part by weight of γ-glycidoxypropyltrimethoxy silane (KBM403, Shin-Etsu Chemical) were mixed into an anisotropic conductive film composition. These components were mixed with 100 parts by weight of PGEMA as a solvent, followed by coating and drying.

EXAMPLE 3

Preparation of Anisotropic Conductive Film Composition Including Hydrogenated Bisphenol A Epoxy Oligomer An anisotropic conductive film composition was prepared in the same manner as in Example 1 except that 14 parts by weight of a hydrogenated bisphenol A epoxy oligomer (Formula 2) was used instead of 14 parts by weight of a hydrogenated bisphenol A epoxy monomer (Formula 1).

EXAMPLE 4

Preparation of Anisotropic Conductive Film Composition Including Hydrogenated Bisphenol A Epoxy Monomer and Hydrogenated Bisphenol A Epoxy Oligomer An anisotropic conductive film composition was prepared in the same manner as in Example 1 except that 10 parts by weight of a hydrogenated bisphenol A epoxy monomer (Formula 1) and 4 parts by weight of a hydrogenated bisphenol A epoxy oligomer (Formula 2) were used instead of 14 parts by weight of a hydrogenated bisphenol A epoxy monomer (in Formula 1).

COMPARATIVE EXAMPLE 1

Preparation of Anisotropic Conductive Film Composition

An anisotropic conductive film composition was prepared in the same manner as in Example 1 except that 16 parts by weight of polycyclic aromatic ring containing epoxy (HP4032D, Dainippon Ink & Chemicals) was used instead of 14 parts by weight of a hydrogenated bisphenol A epoxy monomer (Formula 1) and 2 parts by weight of polycyclic aromatic ring containing epoxy (HP4032D, Dainippon Ink & Chemicals).

Comparative Example 2

Preparation of Anisotropic Conductive Film Composition

An anisotropic conductive film composition was prepared in the same manner as in Example 2 except that 19 parts by weight of diglycidyl terephthalate epoxy (EX-711, Nagase ChemteX) was used instead of 3 parts by weight of a fluorene BPA resin (FX-293, Shin Nippon Steel Corp.), 11 parts by weight of a hydrogenated bisphenol A epoxy monomer (Formula 1), and 5 parts by weight of diglycidyl terephthalate epoxy (EX-711, Nagase ChemteX).

EXAMPLE 5

Preparation of Anisotropic Conductive Film

Each of the compositions prepared in Examples 1 to 4 and Comparative

Examples 1 and 2 was applied a white release film and dried in a drier at 80° C., thereby producing an anisotropic conductive film having a thickness of 20 um.

EXPERIMENTAL EXAMPLE 1

Evaluation of curing rates of anisotropic conductive films of Example 5.

A glass substrate having an indium tin oxide (ITO) circuit with a bump area of 2,000 μm$^2$ and a thickness of 5,000 Å and a chip having a bump area of 2,000 μm$^2$ and a thickness of 0.7 mm were bonded and pressed together using each anisotropic conductive film obtained in Example 5, followed by pressing and heating at 170° C. and 90 MPa for 5 seconds, thereby preparing one sample of each anisotropic conductive film. After the chip was separated using a die shear, the anisotropic conductive film remaining on the glass substrate was scraped off and evaluated as to curing rate using IR. Defining a peak in a range of 1,540 to 1,480 cm$^{-1}$ as benzene ring absorption and a peak in a range of 930 to 889 cm$^{-1}$ as epoxy ring absorption, curing rate was calculated by the following equation.

$$T(x)=E(x)/B(x)$$

E: Epoxy ring absorption;
B: Benzene ring absorption;
T: Spectral intensity ratio of epoxy ring absorption against benzene ring absorption;
T(100): spectral intensity ratio of a 100% cured sample;
T(0): spectral intensity ratio of a 0% cured sample;
T(?): spectral intensity ratio of the unknown reaction rate sample; and $$\text{Curing rate}=\{(T(?)-T(0))/(T(100)-T(0))\}\times 100(\%).$$

Curing rate results are provided in Table 1.

TABLE 1

| | Example 1 | Example 2 | Example 3 | Example 4 | Comparative Example 1 | Comparative Example 2 |
|---|---|---|---|---|---|---|
| Curing rate (%) | 82 | 81 | 80 | 82 | 64 | 71 |

EXPERIMENTAL EXAMPLE 2

Evaluation of glass transition temperature of anisotropic conductive films of Example 5.

Each anisotropic conductive film obtained in Example 5 was formed into a three-layer film with a thickness of 60 μm, which was then cured at 190° C. for 1 hour and cut into a 30 mm×5 mm sample, followed by evaluation of glass transition temperature using dynamic mechanical analysis DMA.

Glass transition temperature results are provided in Table 2.

TABLE 2

|  | Example 1 | Example 2 | Example 3 | Example 4 | Comparative Example 1 | Comparative Example 2 |
|---|---|---|---|---|---|---|
| Glass transition temperature (Tg, ° C.) | 132 | 141 | 137 | 135 | 147 | 121 |

EXPERIMENTAL EXAMPLE 3

Evaluation of connection reliability of anisotropic conductive films of Example 5.

To evaluate the connection reliability of each anisotropic conductive film obtained in Example 5, the resistance of each anisotropic conductive film was measured as follows.

(1) Preparation of Sample

A glass substrate having an indium tin oxide (ITO) circuit with a bump area of 2,000 μm² and a thickness of 5,000 Å and a chip having a bump area of 2,000 μm² and a thickness of 1.7 mm were bonded and pressed together using each anisotropic conductive film obtained in Example 5, followed by pressing and heating at 170° C. and 90 MPa for 5 seconds, thereby preparing 5 samples of each anisotropic conductive film.

(2) Measurement of initial connection resistance

The connection resistance of each completely bonded sample was measured 5 times, and an average connection resistance was calculated.

(3) Measurement of Connection Resistance after Reliability Test

After measuring the initial connection resistance, each sample was subjected to high-temperature and high-humidity conditions of 85° C. and 85% humidity, for 100 hours, 250 hours, and 500 hours, followed by measurement of connection resistance and calculation of an average connection resistance.

The average initial connection resistance and the average connection resistance after reliability testing of each sample are provided in Table 3.

TABLE 3

|  | Example 1 | Example 2 | Example 3 | Example 4 | Comparative Example 1 | Comparative Example 2 |
|---|---|---|---|---|---|---|
| Initial connection resistance (Ω) | 0.52 | 0.48 | 1.5 | 0.63 | 11.8 | 1.0 |
| Connection resistance after reliability test (Ω) | 1.6 | 1.4 | 2.9 | 1.8 | 62.9 | 11.3 |

As shown in Table 3, the resistance of the connection using the film according to Comparative Example 1 after reliability testing under high-temperature and high-humidity conditions increased about 5.33 times as compared with the initial resistance. The resistance of the connection using the film according to Comparative Example 2 increased about 11.3 times. However, the resistance of the connection using the film according to Example 1 increased about 3.07 times, while the resistance of the connection using the film according to Example 2 increased by about 2.9 times.

The anisotropic conductive film prepared using a hydrogenated bisphenol A epoxy monomer represented by Formula 1 may have relatively dense and hard properties, and thus may have substantially improved heat resistance and moisture resistance, and substantially improved reliability.

By way of summary and review, an anisotropic conductive film (ACF) may refer to a film-like adhesive in which conductive particles are dispersed in a resin. The anisotropic conductive film may be a polymer-based layer having electric anisotropy and an adhesive property, and may exhibit conductive properties in the thickness direction of the film and insulating properties in the surface direction of the film. Such anisotropic conductive films may be used, e.g., to electrically connect elements of electronic devices, e.g., liquid crystal display (LCD) panels, printed circuit boards, tape carrier packages (TCPs), semiconductor devices, and the like.

When an anisotropic conductive film is disposed adjacent to a circuit board and subjected to heating and pressing under suitable conditions, circuit terminals of the circuit board may be electrically connected through conductive particles, and an insulating adhesive resin may fill in spaces between adjacent circuit terminals to make the conductive particles independent from each other, thereby achieving high insulation performance between the circuit terminals.

A thermally curable insulating resin may be used for an anisotropic conductive film. The thermally curable resin may experience curing shrinkage due to a volume change resulting from the temperature difference of the thermal curing. When curing shrinkage occurs, the anisotropic conductive film may be substantially deteriorated in dimensional stability, and thus may cause an increase in defect rate. In particular, an epoxy resin may be used as a thermally curable resin for improved adhesive strength, heat resistance, and moisture resistance, but may have a relatively high bonding temperature and a substantially long bonding time, thereby causing an increased possibility of defects after film formation.

A chip-on-glass (COG) is a chip mounting technique for mounting chips on a glass substrate, e.g., having a thin film circuit formed thereon. The COG may enable an IC to be directly mounted on a liquid crystal glass panel in a liquid crystal display. An anisotropic conductive film for COG may be expected to have an adhesive strength of at least about 30 MPa or more and suitable connection resistance so as to securely hold and connect an IC (e.g., a drive IC) to the panel, not only initially, but also after reliability testing. However, anisotropic conductive films for COG may have a low modulus after curing and may be vulnerable to heat and humidity, thereby substantially reducing the reliability of the connected product.

The conditions discussed above related to anisotropic conductive films with a relatively high bonding temperature and a substantially long bonding time (thereby causing defects) and anisotropic conductive films with a low modulus after curing and increased vulnerability to heat and humidity (thereby causing unreliable connections) may be substantially avoided by using the anisotropic conductive films disclosed herein.

The anisotropic conductive film compositions disclosed herein may include a sulfonium curing agent, and thus may be relatively rapidly cured at low temperature. More particularly, the anisotropic conductive film composition may have a curing rate of 70% or more when cured at 150 to 170° C. for 5 to 10 seconds. Thus, shrinkage due to volume change and defects resulting therefrom may be substantially reduced.

The anisotropic conductive film composition disclosed herein may also include a hydrogenated bisphenol A epoxy monomer and/or oligomer, and thus may be relatively hard and may exhibit substantially improved moisture resistance and heat resistance, and accordingly may be particularly useful as an anisotropic conductive film for chip-on-glass (COG). More particularly, the anisotropic conductive film may provide a glass transition temperature of 120° C. or more. Thus, the anisotropic conductive film may have substantially improved resistance to deformation by temperature or humidity, and thus may have relatively high connection reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device bonded by an anisotropic conductive film composition, the anisotropic conductive film composition comprising:

a first component that includes one or more selected from the group of a hydrogenated bisphenol A epoxy monomer represented by Formula 1 and a hydrogenated bisphenol A epoxy oligomer represented by Formula 2:

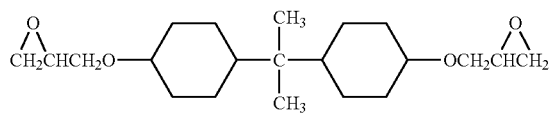

[Formula 1]

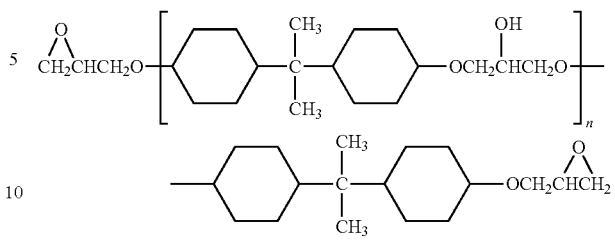

[Formula 2]

wherein n is an integer from 1 to about 50;
a sulfonium curing agent;
a binder resin; and
conductive particles.

2. The semiconductor device as claimed in claim 1, wherein the first component includes the hydrogenated bisphenol A epoxy monomer represented by Formula 1 and the hydrogenated bisphenol A epoxy oligomer represented by Formula 2.

3. The semiconductor device as claimed in claim 1, wherein the anisotropic conductive film composition includes:
about 1 to about 50 parts by weight of the first component;
about 1 to about 20 parts by weight of the sulfonium curing agent;
about 20 to about 60 parts by weight of the binder resin; and
about 10 to about 50 parts by weight of the conductive particles;
based on 100 parts by weight of the anisotropic conductive film composition.

4. The semiconductor device as claimed in claim 1, wherein the sulfonium curing agent includes an aromatic sulfonium salt.

5. The semiconductor device as claimed in claim 4, wherein the aromatic sulfonium salt is represented by Formula 3:

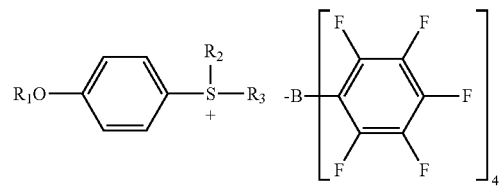

[Formula 3]

wherein:
$R_1$ is selected from the group of hydrogen, an alkyl group, an alkoxy group, a methoxy carbonyl group, and an ethoxy carbonyl group;
$R_2$ is selected from the group of a methyl group, an ethyl group, a propyl group, and a butyl group; and
$R_3$ is selected from the group of a nitrobenzyl group, a dinitrobenzyl group, a trinitrobenzyl group, and a naphthylmethyl group.

6. The semiconductor device as claimed in claim 1, wherein the sulfonium curing agent includes a sulfonium salt represented by Formula 4:

[Formula 4]

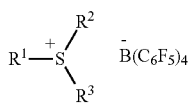

wherein $R^1$ is selected from the group of a benzyl group, a substituted benzyl group, a phenacyl group, a substituted phenacyl group, an alkyl group, a substituted alkyl group, an alkoxy group, a substituted alkoxy group, an aryloxy group, and a substituted aryloxy group;

$R^2$ and $R^3$ each independently are selected from the group of a benzyl group, a substituted benzyl group, a phenacyl group, a substituted phenacyl group, an alkyl group, a substituted alkyl group, an alkoxy group, a substituted alkoxy group, an aryloxy group, a substituted aryloxy group, fluorine, chlorine, bromine, a hydroxyl group, a carboxyl group, a mercapto group, a cyano group, a nitro group, a $C_1$ to $C_{18}$ straight, branched, or cyclic alkyl group, and a substituted $C_1$ to $C_{18}$ straight, branched, or cyclic alkyl group; and $R^1$ and $R^2$, $R^1$ and $R^3$, or $R^2$ and $R^3$ optionally are combined with each other into a cyclic structure.

7. The semiconductor device as claimed in claim 4, wherein the aromatic sulfonium salt is represented by Formula 5:

[Formula 5]

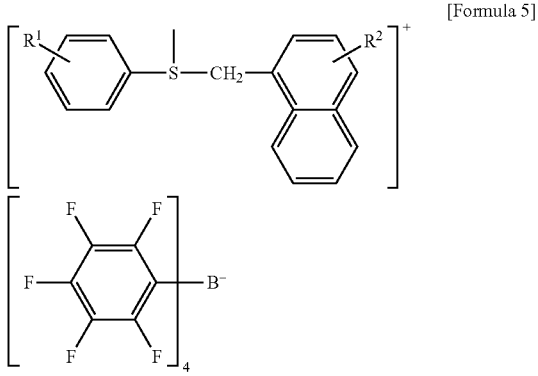

wherein:
$R^1$ is selected from the group of a hydroxyl group, $R^5O$—,

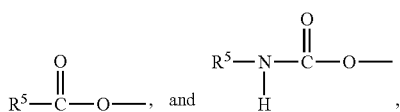

$R^5$ is selected from the group of an aromatic hydrocarbon, a substituted aromatic hydrocarbon, an aliphatic hydrocarbon, a substituted aliphatic hydrocarbon, a carboxyl group, a sulfonyl group, and combinations thereof; and $R^2$ is selected from the group of hydrogen and $C_1$ to $C_6$ alkyl groups.

8. The semiconductor device as claimed in claim 1, wherein the sulfonium curing agent includes:

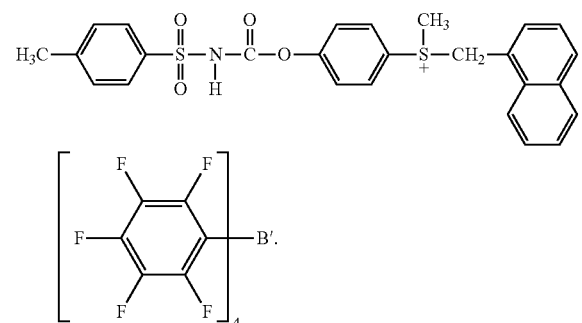

9. The semiconductor device as claimed in claim 1, wherein the binder resin includes an epoxy resin having at least two epoxy groups and having an epoxy equivalent weight of about 90 g/eq to about 5,000 g/eq.

10. The semiconductor device as claimed in claim 1, wherein the binder resin has a weight average molecular weight of about 5,000 g/mol to about 150,000 g/mol.

11. The semiconductor device as claimed in claim 1, wherein the binder resin includes a fluorene epoxy resin.

12. The semiconductor device as claimed in claim 1, wherein the conductive particles include at least one selected from the group of metal particles and organic or inorganic particles coated with a metal.

13. The semiconductor device as claimed in claim 1, wherein the anisotropic conductive film composition provides a glass transition temperature of about 120° C. or more.

14. The semiconductor device as claimed in claim 1, wherein the anisotropic conductive film composition is for a chip-on-glass (COG) device.

15. An semiconductor device, comprising:
    a wiring substrate, the wiring substrate including glass; and
    an electrical element bonded to the wiring substrate by an anisotropic conductive film that is a cured product of the anisotropic conductive film composition as according to claim 1.

16. A semiconductor device bonded by an anisotropic conductive film formed from a composition, the composition comprising:
    a hydrogenated bisphenol A epoxy monomer represented by Formula 1 or a hydrogenated bisphenol A epoxy oligomer represented by Formula 2:

[Formula 1]

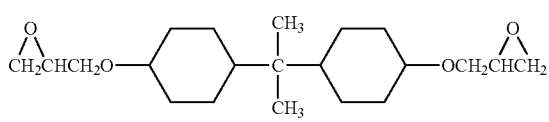

[Formula 2]

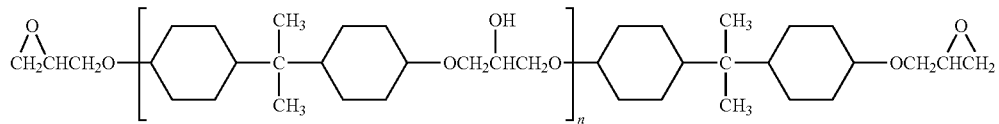

wherein n is an integer from 1 to about 50,
the anisotropic conductive film having:
a curing rate of about 70% or more when cured at about 150 to about 170° C. for about 5 to about 10 seconds, and
a glass transition temperature of about 120° C. or more.

17. The semiconductor device as claimed in claim 16, wherein the curing rate of the anisotropic conductive film is about 70% or more when cured at about 150° C. for about 5 to 10 seconds.

18. The semiconductor device as claimed in claim 16, wherein the anisotropic conductive film bonds a chip-on-glass (COG) device.

* * * * *